United States Patent
Chun

(10) Patent No.: US 9,639,128 B2
(45) Date of Patent: May 2, 2017

(54) SYSTEM AND METHOD FOR THERMOELECTRIC MEMORY TEMPERATURE CONTROL

(71) Applicant: QUALCOMM INCORPORATED, San Diego, CA (US)

(72) Inventor: Dexter Tamio Chun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/818,180

(22) Filed: Aug. 4, 2015

(65) Prior Publication Data

US 2017/0038805 A1 Feb. 9, 2017

(51) Int. Cl.
*G06F 1/20* (2006.01)
*G06F 3/06* (2006.01)

(52) U.S. Cl.
CPC .............. *G06F 1/206* (2013.01); *G06F 1/203* (2013.01); *G06F 3/0604* (2013.01); *G06F 3/0653* (2013.01); *G06F 3/0673* (2013.01)

(58) Field of Classification Search
None
See application file for complete search history.

(56) References Cited

U.S. PATENT DOCUMENTS

| | | | | |
|---|---|---|---|---|
| 5,272,535 A * | 12/1993 | Elabd | ...................... | H04N 3/155 348/314 |
| 6,230,497 B1 * | 5/2001 | Morris | ...................... | F25B 21/04 257/E23.08 |
| 7,436,059 B1 | 10/2008 | Ouyang | | |
| 8,307,270 B2 | 11/2012 | Kim et al. | | |
| 2006/0004537 A1 | 1/2006 | Jain et al. | | |
| 2013/0078609 A1* | 3/2013 | Tverskoy | ................ | C12P 19/34 435/3 |
| 2015/0082811 A1 | 3/2015 | Rangarajan et al. | | |
| 2015/0094875 A1* | 4/2015 | Duzly | ................ | G05D 23/1919 700/300 |
| 2015/0185741 A1* | 7/2015 | Rangarajan | ............ | G05B 15/02 700/300 |

OTHER PUBLICATIONS

Daeyong Shim et al., "A Process-Variation-Tolerant On-Chip CMOS Thermometer for Auto Temperature Compensated Self-Refresh of Low-Power Mobile DRAM," IEEE Journal of Solid-State Circuits, Jul. 24, 2013, pp. 2550-2557, vol. 48.
Soojung Rho et al., "Energy Minimization of 3D Cache-Stacked Processor Based on Thin-Film Thermoelectric Coolers," IEEE International Midwest Symposium on Circuits and Systems, pp. 1-04.
International Search Report and Written Opinion—PCT/US2016/041693—ISA/EPO—Oct. 11, 2016(153095WO).

* cited by examiner

*Primary Examiner* — Dennis M Butler
(74) *Attorney, Agent, or Firm* — Smith Tempel

(57) ABSTRACT

Systems, methods, and computer programs, embodied in or as a memory management module, are disclosed for thermally controlling memory to increase its performance. One exemplary embodiment includes a memory, one or more processors, and a thermoelectric cooling device. The one or more processors access the memory via a memory controller electrically coupled to the memory. The thermoelectric cooling device is configured to thermally control the memory in response to a predicted change in temperature of the memory.

40 Claims, 14 Drawing Sheets

| MEMORY TEMPERATURE "T" (celsius) | HEAT TRANSFER "Q" (mW) | | | | |
|---|---|---|---|---|---|
| | 0 mW | 100 mW | 200 mW | 300 mW | 400 mW |
| < 0 | 0 | 75 | 150 | 300 | 600 |
| 0 - 20 | 0 | 75 | 150 | 300 | 600 |
| 20 - 40 | 0 | 75 | 150 | 300 | 600 |
| 40 - 60 | 0 | 75 | 150 | 300 | 600 |
| 60 - 80 | 0 | 75 | 150 | 300 | 600 |
| 80 - 100 | 0 | 75 | 150 | 300 | 600 |

FIG. 5

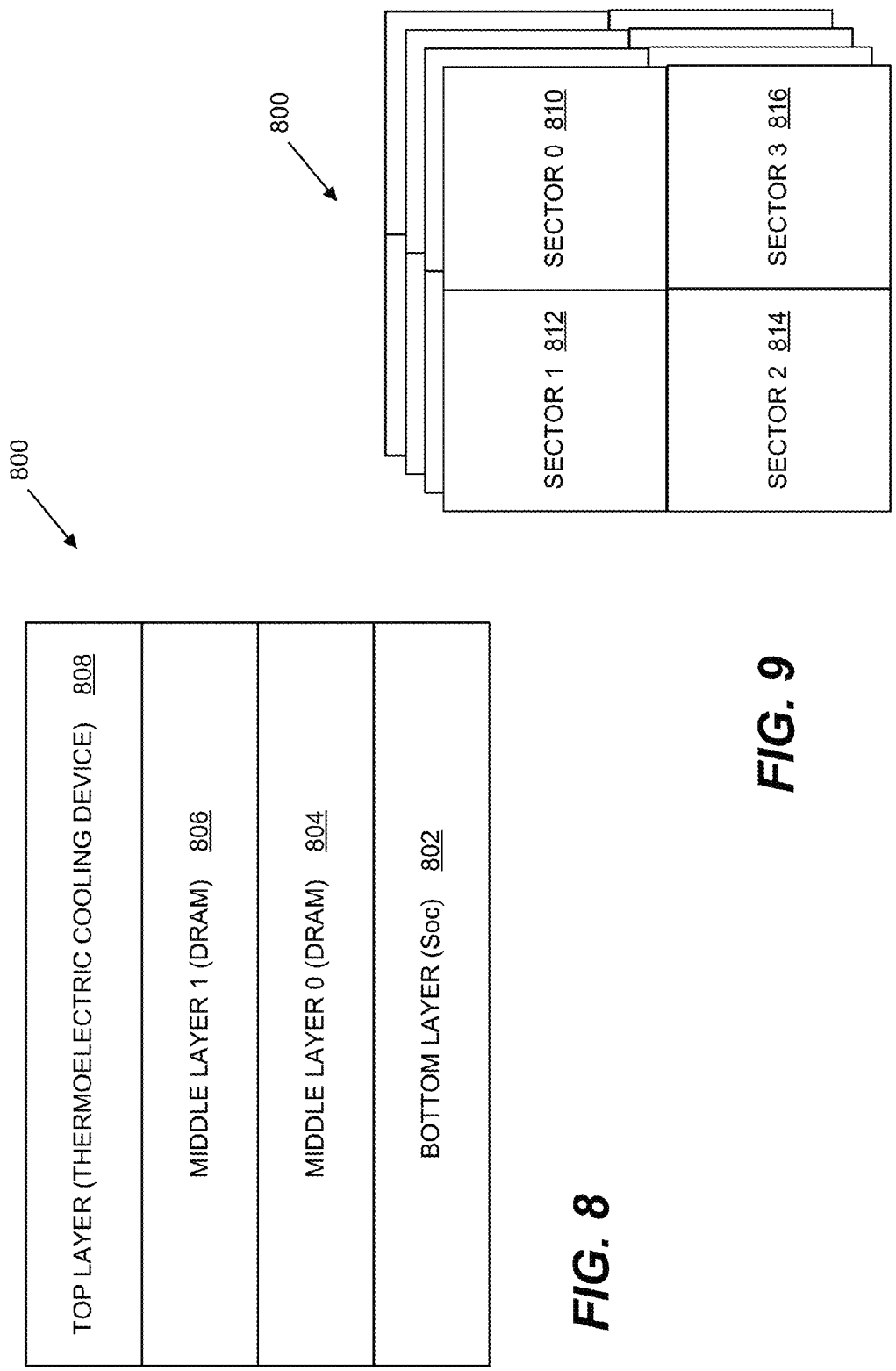

802

| MODEM PROCESSOR 1006 (SECTOR 0 810) | GPU 1008 (SECTOR 3 816) |
| --- | --- |
| TS 322   TS 322  LS 318  TS 322   TS 322 | TS 322   TS 322  LS 318  TS 322   TS 322 |
| CPU 1002 (SECTOR 1 812) | VIDEO PROCESSOR 1004 (SECTOR 2 814) |
| TS 322   TS 322  LS 318  TS 322   TS 322 | TS 322   TS 322  LS 318  TS 322   TS 322 |

SYSTEM AND METHOD FOR THERMOELECTRIC MEMORY TEMPERATURE CONTROL

BACKGROUND

Computing devices (e.g., servers, desktop or laptop personal computers, tablet computers, smartphones, portable game consoles, etc.) and other electronic components and devices may include one or more processors for accessing a memory that is electrically coupled to a memory controller via a bus. The processing power and memory performance of such devices continue to increase to meet consumer and industrial demands. It may be desirable to use memory that offers the highest possible performance in devices and applications such as, servers, graphics engines, networking processors, search processors, defense electronics, and automotive electronics. However, as memory bandwidth increases, variations in memory temperature can become more problematic and negatively impact the intended performance and operation of the memory.

For example, in existing dynamic random access memory (DRAM) interfaces, such as, Low Power Double Data Rate (LPDDR), Graphics Double Data Rate (GPDDR), High Bandwidth Memory (HBM), Hybrid Memory Cube (HMB), etc., bus timing parameters may be adversely impacted by temperature variations. High-performance DRAM interfaces must handle extremely small tolerances in their timing budget in order to achieve increased signaling rates. Current DRAM supports external interfaces that can communicate with, for example, a system on chip (SoC) at speeds up to and exceeding 7 Gigabytes per second (Gbs). One example of a critical DRAM timing parameter subject to temperature variation is the timing path between the DRAM internal clock strobe and the data bus input/output (I/O) pins (referred to in the art as "DQ" pins). This timing path originates from a DQ strobe receiver pin (referred to in the art as a "DQS" pin) and then fans out to each of the DQ pins. Even relatively small temperature variations in the DRAM can alter the delay of the DQS signal along this timing path, which directly influences the speed of communications between the SoC and the DRAM bus. This is because the rising and falling edges of the DQS signal are used to sample the DQ signals, and DQS edges should ideally be aligned with the center (in-between signal transitions) of each DQ bit to ensure that DQ is stable and has the correct (logic high or logic low) voltage when it is sampled. Changes in the delay of DQS can result in DQ being sampled too early or too late (i.e. offset from the ideal center point) during which DQ may be unstable or may not be at a proper voltage.

Existing solutions for addressing DRAM temperature drift are limited. For lower frequencies (e.g., under 2 Gbs), DRAM temperature variation may be handled by over-designing or over-margining the SoC-to-DRAM interface such that any value of temperature drift will not violate any timing. As frequencies increase, however, it may not be possible to over-design the system. Therefore, the DRAM temperature drift must be periodically measured and, if the timing drift of DQS exceeds a threshold, timing recalibration must be performed. During recalibration, the system measures the amount of DQS temperature drift and then compensates by inserting or removing time delay on the DQS signal using programmable delay circuits within the SoC. Depending on the workload, the system temperature and the DRAM temperature may rise and fall, which leads to temperature-induced timing drift. If left uncorrected, the timing drift may result in bit errors on the interface. Furthermore, there is a performance penalty when resolving timing drift in this manner. Periodic recalibration places the DRAM offline during which the DRAM data cannot be accessed, thereby reducing memory performance. These problems will only be exacerbated as memory speeds continue to increase.

Accordingly, there is a need for improved systems and methods for managing memory temperature variations, which can negatively impact the performance and operation of memory, such as, DRAM.

SUMMARY OF THE DISCLOSURE

Systems, methods, and computer programs, and specifically, a memory management module are disclosed for thermally controlling memory. One exemplary embodiment is a system comprising a memory, one or more processors, and a thermoelectric cooling device. The one or more processors access the memory via a memory controller electrically coupled to the memory. The thermoelectric cooling device is configured to thermally control the memory in response to a predicted change in temperature of the memory.

Another exemplary embodiment is a method performed by a memory management module for thermally controlling memory. A temperature of a memory accessed by one or more processors via a memory controller is determined. Based on the temperature of the memory, a temperature change of the memory is predicted. The memory is thermally controlled, via a thermoelectric cooling device, in response to the predicted temperature change.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 5 is an exemplary embodiment of a look-up table for determining a power input for an exemplary thermoelectric cooling device.

FIG. 8 is a side view of an exemplary embodiment of a multi-layer, sectored electronic package for providing distributed thermoelectric memory temperature stabilization.

FIG. 9 is an overhead isometric view of the multi-layer, sectored electronic package of FIG. 8.

FIG. 10a is an overhead view of the bottom SoC layer in the multi-layer, sectored electronic package of FIG. 8.

FIG. 10c is an overhead view of the middle DRAM layer 1 in the multi-layer, sectored electronic package of FIG. 8.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Figure 1:
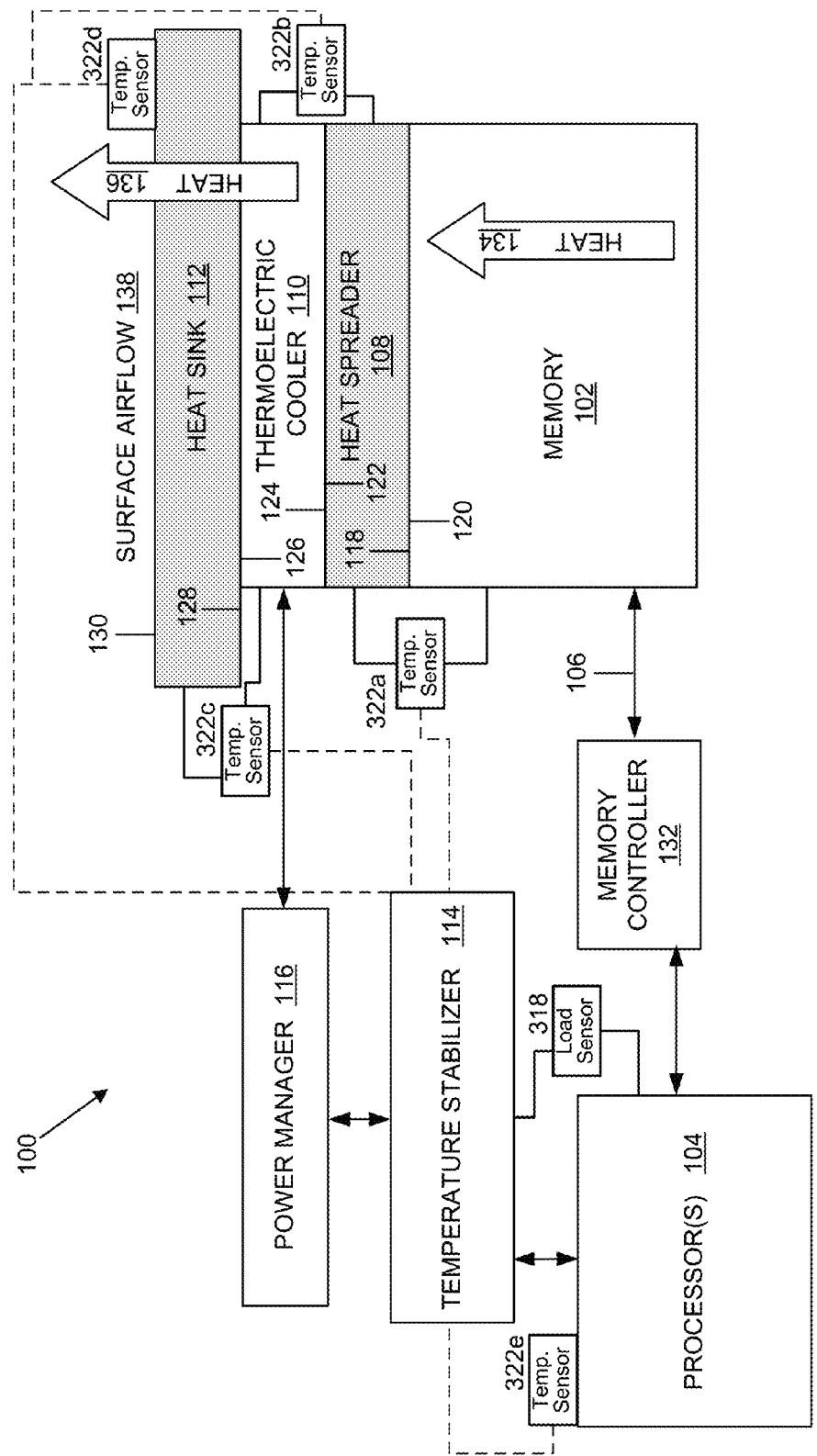
FIG. 1 is a block diagram of an exemplary embodiment of a system for thermally stabilizing a memory via a thermoelectric cooling device.

FIG. 1 illustrates an exemplary embodiment of a system or a memory management module 100 for managing temperature variations experienced by a memory 102 via a thermoelectric cooling device 110. The system 100 may be incorporated in various types of computing devices (e.g., servers, desktop or laptop personal computers, tablet computers, smartphones, portable game consoles, etc.) and other electronic components, packages, and devices.

The system 100 may comprise one or more processors 104 that request memory resources (e.g., read and write operations) from the memory 102. The processors 104 may comprise one or more processing units (e.g., a central processing unit (CPU), a graphics processing unit (GPU), a digital signal processor (DSP), a video processor, a modem processor, etc.) or any other clients requesting read/write access to the memory 102. The processors 104 communicate with a memory controller 132. The memory controller 132 communicates with the memory 102 via a data bus 106. The memory controller 132 manages the flow of data going to and from the memory 102 relative to the processor(s) 104.

The system 100 further comprises a temperature stabilizer 114, which may communicate with the processors 104 (or other components in the system 100), as well as a power manager 116. The temperature stabilizer 114 may be implemented in hardware, software, and/or firmware. It should be appreciated that software may be executed by any suitable processing device, such as processor(s) 104. The temperature stabilizer 114 may generally comprise logic for controlling the thermoelectric cooling device 110. The thermoelectric cooling device 110 may be thermally coupled to a heat spreader 108 between the memory 102 and a heat sink 112.

As described below in more detail, the temperature stabilizer 114 may be configured to predict when the temperature of the memory 102 may increase or decrease due to heat being generated during operation of the system 100 and/or due to any increases or decreases in ambient temperature outside of the device that contains the system 100. Memory temperature variation may be predicted by the temperature stabilizer 114, for example, by monitoring the present temperature of the memory 102 and the current workload being performed by the one or more processors 104.

In other exemplary embodiments, additional data that may be considered by the temperature stabilizer 114 may include the present temperatures of the processors 104 and ambient temperature outside of the device containing the system 100. Other data may include the present and/or predicted workload of other heat-generating components that may cause heating of the memory 102.

The temperature stabilizer 114 may thermally stabilize the memory 102 in response to the predicted temperature change by controlling/regulating the amount of heat transfer 136. Specifically, the amount of heat transfer 136 may be controlled or regulated by the thermoelectric cooling device 110. A signal may be generated and provided by the temperature stabilizer 114 to the power manager 116 in accordance with a predicted temperature change as determined by the temperature stabilizer 114.

In an exemplary embodiment, the temperature stabilizer 114 may send a signal to the power manager 116. In response to that signal from the temperature stabilizer 114, the power manager 116 may produce a signal that may control a voltage or an electrical current of a power source (not shown) provided to the thermoelectric cooler device 110. This adjustment to the voltage and/or current of the thermoelectric cooler may allow more or less heat transfer 136 from the memory 102 through the heat sink 112 to a surface airflow 138.

When the temperature stabilizer 114 predicts an increase in temperature for the memory 102, a control signal from the stabilizer 114 may instruct the power manager 116 to increase the heat transfer 134 to the heat sink 112 by an amount that may stop a temperature of the memory 102 from increasing or it may reduce the rate of temperature increase for the memory 102.

Similarly, when the temperature stabilizer predicts a decrease in temperature for the memory 102, the control signal may instruct the power manager 116 to decrease the amount of heat transfer 134 to the heat sink 112 by an amount that may stop a decrease in temperature for memory 102 or it may reduce the rate of temperature decrease for the memory 102.

In this manner, the temperature stabilizer 114 may actively reduce or "stabilize" memory temperature variations that may negatively impact memory performance and/or operation. It should be appreciated that this thermal stabilization from the stabilizer 114 may be configured to eliminate or significantly reduce rapid temperature changes, filter out temperature fluctuations (represented as potential peaks and valleys in a graph), maintain a desired mean temperature for a predetermined/calculated time interval, and/or approximate isothermal conditions in which temperature of the memory 102 is maintained at an approximate constant temperature. As a result, the magnitude and rate of the timing drift of the DQS signal may be reduced, which may advantageously reduce the need to perform any timing recalibrations.

In one exemplary embodiment, the thermoelectric cooling device 110 may comprise a Peltier-type thermoelectric cooler. Such cooling devices 110 may be referred to in the art as thermoelectric coolers (TECs) or thermoelectric modules (TEMs). Exemplary types of Peltier cooling modules include, but are not limited to, high-performance types, high temperature types, micro types, multistage types, round (+/−) center hole, rectangle (+) center hole, series-parallel types, and standard types of Peltier cooling modules. However, the system 100 is not limited to TECs or TEMs. The system 100 may also employ thermomagnetic coolers or thermionic emission coolers as alternative cooling devices 110 for TEMs as understood by one of ordinary skill in the art.

TECs typically create a heat flux between the junctions of two different types of materials. As illustrated in FIG. 1, the thermoelectric cooling device 110 comprises a bottom "cooled" side 124 and an upper "hot" side 126. The bottom side 124 is thermally coupled to an upper side 122 of a heat spreader 108. The upper side 126 is thermally coupled to a lower side 128 of a heat sink 112. The lower side 118 of the heat spreader 108 is thermally coupled to an upper surface 120 of the memory 102. The memory 102 may be a single die or may consist of multiple die. The die may be horizontally located within the same plane or may be stacked vertically. The die may be assembled onto a substrate and thermally encapsulated using a mold to form a package.

When electrical current flows through the thermoelectric cooling device 110, the device 110 may transfer heat from one side (i.e., lower side 124) to the other side (i.e., upper side 126), so that one side 124 in effect "gets cooler" while the other side 126 "gets hotter" due to the heat transfer as indicated by the direction of heat arrow 136. The upper "hot" side 126 is thermally coupled to the heat sink 112 such that heat 136 may be transferred through heat sink 112 to the surface airflow 138, while the lower side 124 is in effect "cooled" since heat is removed or transferred from the lower side 124 to the upper side 126 of the cooling device 110.

Figure 2:
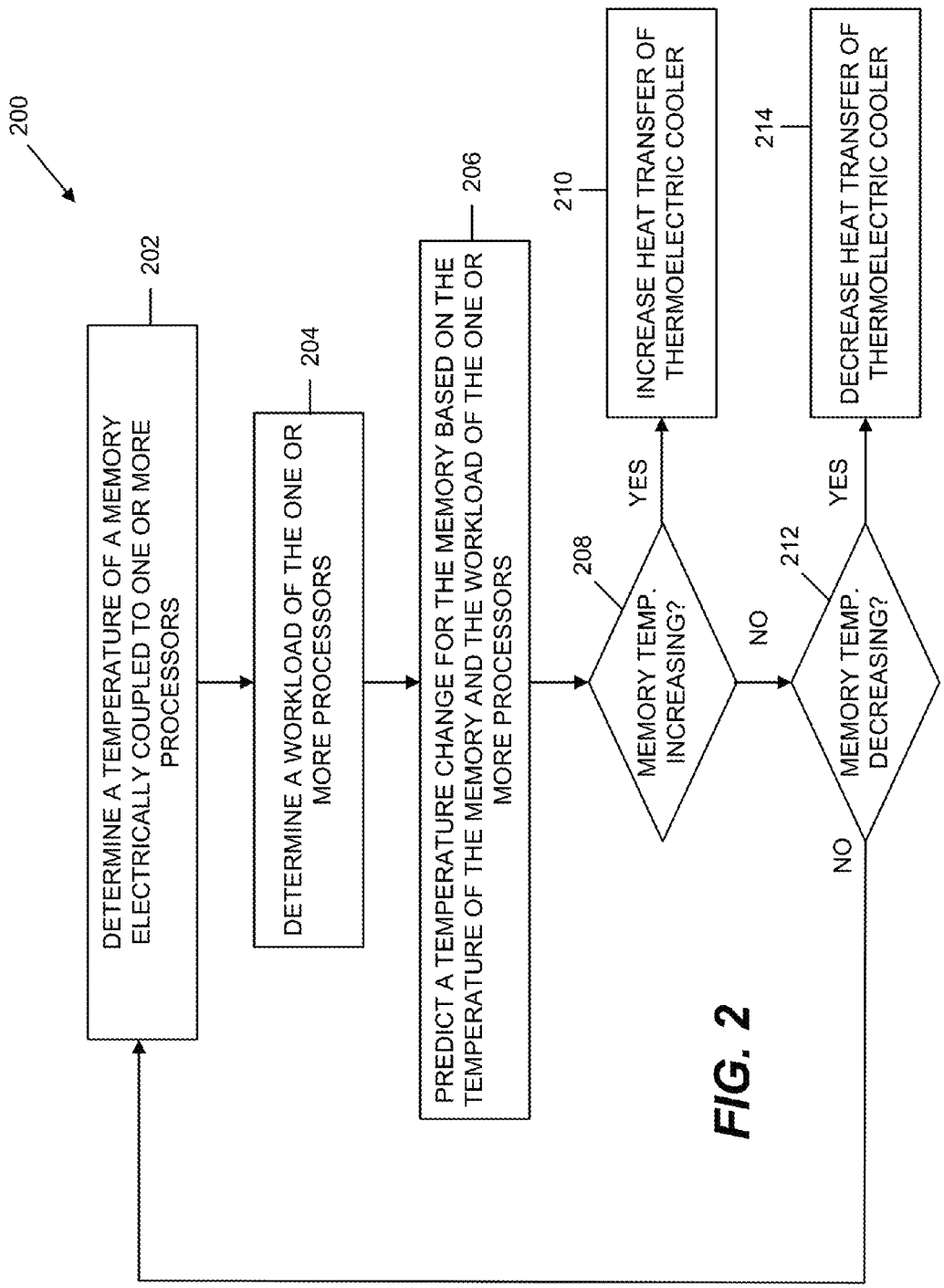
FIG. 2 is a flowchart illustrating an exemplary embodiment of a method implemented in the system of FIG. 1 for stabilizing memory temperature.

FIG. 2 illustrates an exemplary embodiment of a method 200 for thermally stabilizing the memory 102 via the thermoelectric cooling device 110 based on predicted temperature changes. It should be appreciated that the temperature stabilizer 114 or other components of the system 100 may implement one or more aspects of the method 200. At block 202, a present temperature of the memory 102 may be determined by the temperature stabilizer 114. One or more temperature sensors 322a, 322b, 322c, and 322d, such as illustrated in FIG. 1, may report localized temperatures for one or more physical locations within the memory 102 to the temperature stabilizer 114. Each temperature sensor 322 may comprise, for example, one or more proportional to absolute temperature (PTAT) temperature sensors that are based on vertical PNP structure of the type known to be usable with CMOS very large-scale integration (VLSI) circuits. In other exemplary embodiments, the temperature sensors 322 may comprise, for example, one or more thermistors. In response to temperature, temperature sensors 322 may produce a voltage drop. An analog-to-digital converter (ADC) controller (not illustrated) may convert the voltage drops to digital signals and may provide the digital signals the temperature stabilizer 114. A combination of PTAT sensors 322 and thermistor sensors 322 may be employed. However, in other exemplary embodiments, other types of thermal or temperature sensors 322 may be employed without departing from the scope of this disclosure.

As illustrated in FIG. 1, the system 100 may comprise one or more load sensors 318 for measuring various loads associated with the processor(s) 104 and/or the memory 102. In an embodiment, the load sensors 318 may comprise a processor utilization load sensor, a memory bandwidth load sensor, or any other sensors for measuring operational conditions that may cause memory temperature changes. Processor utilization load sensor(s) may report current computational workloads of the one or more processors 104. Memory bandwidth load sensor(s) 318 may report current memory bandwidth used by the one or more processors 104. The memory 102 may comprise one or more memory devices or chips with corresponding temperature sensors 322. The temperature stabilizer 114 may read the localized temperatures from the temperature sensors 322.

At block 204, a current workload may be determined by the temperature stabilizer 114 which is associated with the one or more processors 104. The workload may comprise a value corresponding to the amount of workload that a particular processor 104 is currently performing. In an embodiment, the workload value may comprise a processor utilization percentage (e.g., SoC work power) and/or a processor memory bandwidth (e.g., memory power).

At block 206, the temperature stabilizer 114 predicts a temperature change for the memory 102 based on the present memory temperature(s), processor utilization, and/or memory bandwidth. The predicted temperature change may involve calculating a rate of temperature change (i.e., slope) or a temperature difference in relation to a predefined amount. In accordance with the predicted temperature change, the memory 102 is thermally stabilized by controlling the thermoelectric cooling device 110.

If the predicted temperature change comprises an increase in temperature for memory 102 (decision block 208), the temperature stabilizer 114 sends a control signal to the power manager 116 to increase the power to the thermoelectric cooling device 110 to effectuate an increase in the heat transfer 136 (block 210). If the predicted temperature change comprises a decrease in temperature for memory 102 (decision block 212), the temperature stabilizer 114 sends a control signal to the power manager 116 to decrease power to the thermoelectric cooling device 110 to effectuate a decrease in the heat transfer 136 (block 214). The method 200 then repeats. As mentioned previously, temperature stabilization via the thermoelectric cooling device 110 may be particularly beneficial in high-performance memory systems in which relatively small temperature variations can impact the accuracy and stability of memory performance.

Figure 3:
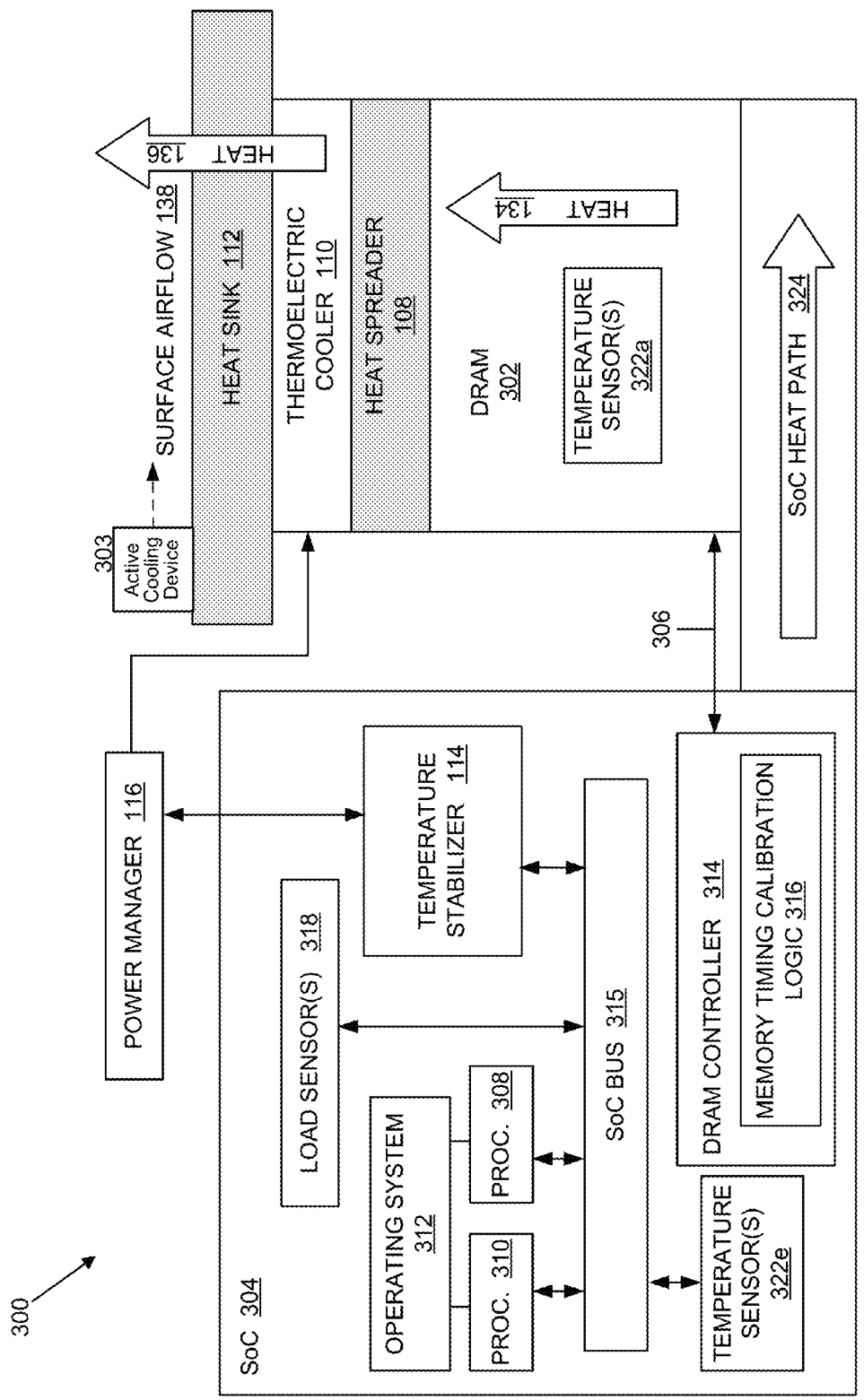
FIG. 3 is a block diagram of another exemplary embodiment of a system for stabilizing DRAM temperature via a thermoelectric cooling device.

Referring now to FIG. 3, this figure illustrates another exemplary embodiment of a system 300 incorporating the temperature stabilizer 114 for stabilizing the temperature of a memory 302, which may comprise dynamic random access memory (DRAM) 302. The DRAM 302 is electrically coupled to a system on chip (SoC) 304 via a high-performance bus 306. As understood by one of ordinary skill in the art, DRAM type memory 302 is a volatile memory type. DRAM may include Double data rate synchronous dynamic random-access memory (DDR SDRAM). The systems 100, 300 described herein are not limited to volatile memory types and may include non-volatile memory types, like Mask ROM (MROM), programmable read-only memory (PROM), field programmable read-only memory (FPROM), one-time programmable non-volatile memory (OTP NVM), erasable programmable read only memory (EPROM), electrically erasable programmable read only memory (EEPROM), magnetoresistive RAM (MRAM), resistive RAM (RRAM), phase change RAM (PCRAM), ferro electric RAM (FERAM), etc.

The preferred embodiments typically employ volatile memory types. Other types of volatile memory besides DRAM memory may be employed without departing from the scope of this disclosure. Other volatile memory 102, 302 besides DRAM memory includes, but is not limited to, Static random-access memory (SRAM), Thyristor RAM (T-RAM), and Zero-capacitor RAM (Z-RAM™).

Referring back to FIG. 3, the DRAM 302 may support any of the following, or other, DRAM interfaces: Single Data Rate (SDR), Double Data Rate (DDR), Low Power Double Data Rate (LPDDR), Graphics Double Data Rate (GDDR), High Bandwidth Memory (HBM), Hybrid Memory Cube (HMB), Quad Data Rate (QDR), Multi-Phase Encoded Data (N-Phase), etc. The DRAM 302 may comprise an external interface with a plurality of input/output (I/O) or DQ pins. The external interface comprises a timing path between an internal clock and the DQ pins. The timing path originates from a DQS receiver pin and then fans out to each of the DQ pins. As mentioned above, the accuracy or stability of this timing path is subject to temperature variation.

For lower frequencies (such as, but not limited to, under 2 Gigabytes per second (Gps)), DRAM temperature variation may be addressed in the system design. As frequencies increase for higher memory performance, the system 300 may employ the temperature stabilizer 114 in the manner described above to address problematic timing drift due to temperature variations. It should be appreciated that thermal stabilization of the DRAM 302 via the thermoelectric cooling device 110 may reduce the frequency with which timing recalibration needs to be performed by memory timing calibration logic 316.

As illustrated in FIG. 3, the SoC 304 comprises a DRAM controller 314, temperature sensor(s) 322e, processors 308 and 310, load sensor(s) 318, and the temperature stabilizer 114 interconnected via a SoC bus 315. In one exemplary embodiment, the processor 308 may comprise a central processing unit (CPU) and the processor 310 may comprise a graphics processing unit (GPU) or a digital signal processor (DSP).

In the system 300, the temperature stabilizer 114, the power manager 116, and the thermoelectric cooling device 110 operate in much the same manner as described above in connection with system 100 of FIG. 1. DRAM 302 may receive heat from its own activity (heat 134) as well as from the SoC 304 via a heat path 324. In the exemplary embodiment of system 300, the temperature stabilizer 114 may be configured to reduce the magnitude of DRAM temperature peaks and valleys by controlling the heat transfer 136 leaving the system 300. Under the control of the temperature stabilizer 114, the thermoelectric cooling device 110 may increase heat transfer when the DRAM temperature is rapidly increasing and reduce heat transfer when the DRAM temperature is rapidly decreasing. The heat spreader 108 may uniformly distribute the in-plane temperature, thereby minimizing local hot spots on the surface of the DRAM 302.

The thermoelectric cooling device 110 may receive power from a power source (not shown) via the power manager 116 whose voltage and current may be modulated by the temperature stabilizer 114. In an exemplary embodiment, the temperature stabilizer 114 may control the voltage and/or an electrical current by an amount needed to raise or lower heat transfer from the DRAM 302 to the heat sink 112.

The temperature stabilizer 114 may increase or decrease a signal to control the voltage and/or electrical current sent to the thermoelectric cooling device 110 to allow more or less heat to flow from the DRAM 302 through the heat sink 112 where it reaches the surface airflow 138 above an upper side 130 of the heat sink 112. In one exemplary embodiment, an active cooling device 303, such as a fan or other active/power consuming cooling means may actively increase thermal energy transfer by increasing the surface airflow 138. It should be appreciated that active cooling may not be feasible or desirable in certain types of devices (e.g., mobile, wearable, etc.) and, therefore, the use of the thermoelectric cooling device 110 may be particularly advantageous.

The temperature stabilizer 114 may use information from temperature sensors 322 and/or load sensor(s) 318 to make predictions on DRAM temperature changes. Processor utilization load sensor(s) may be configured to report an arbitrary number corresponding to the amount of workload that a particular processor 308, 310 is currently performing. Memory bandwidth load sensor(s) may be configured to report an arbitrary number corresponding to the amount of memory bandwidth that a particular processor 308, 310 is currently utilizing. SoC temperature sensor(s) 322e may be configured to report localized instantaneous temperatures for various physical locations within the SoC 304. DRAM temperature sensor(s) 322a may similarly report DRAM temperatures.

Figure 4:
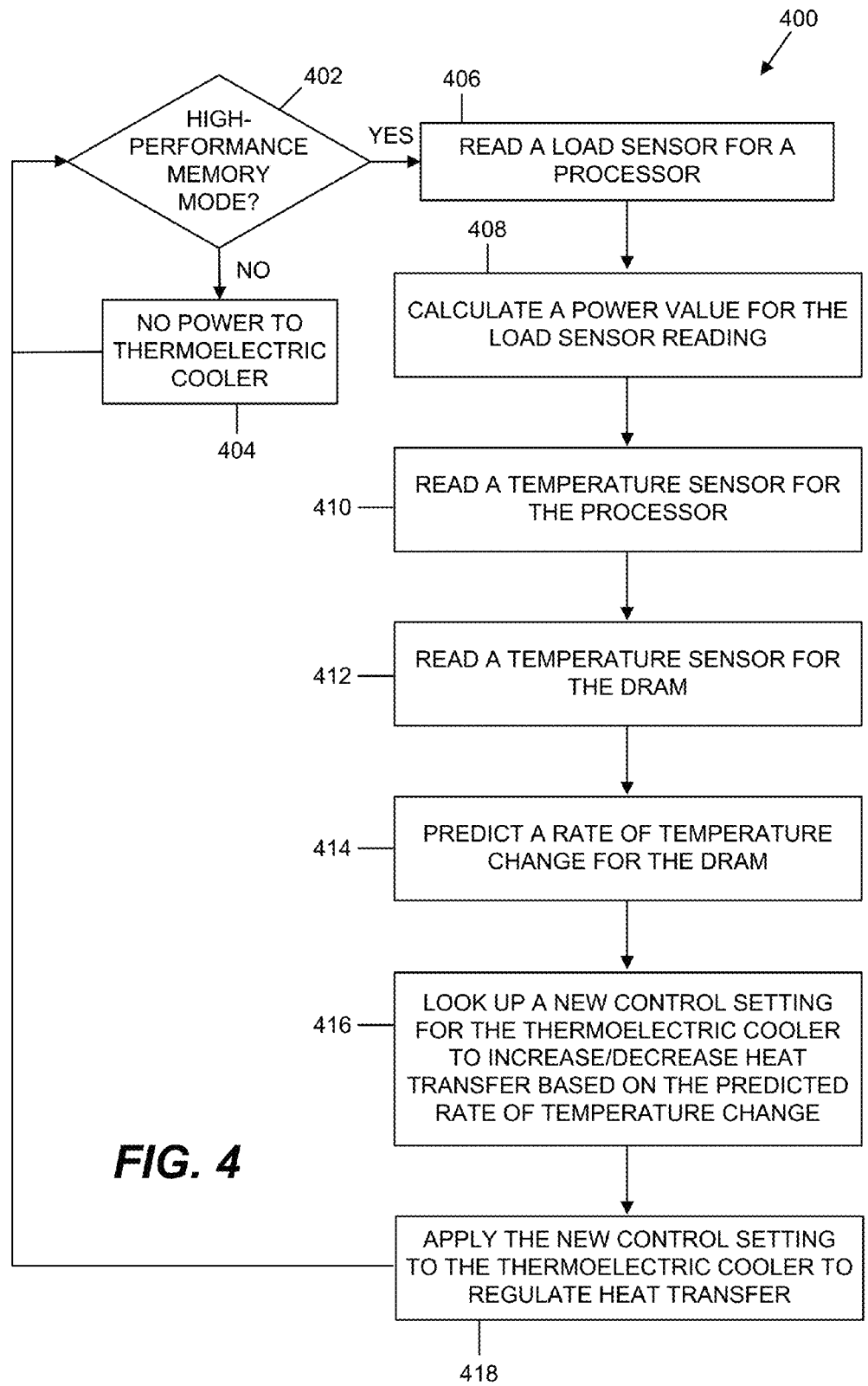
FIG. 4 is a flowchart illustrating an exemplary embodiment of a method implemented in the system of FIG. 3 for controlling DRAM temperature stabilization via the thermoelectric cooling device.

Referring now to FIG. 4, this figure illustrates an exemplary embodiment of a method 400 for controlling DRAM temperature stabilization in the system of FIG. 3. As illustrated at decision block 402, DRAM temperature stabilization may be triggered when a high-performance memory mode is desired. If high-performance is not desired, the system 300 may enter a legacy mode (block 404) in which power to the thermoelectric cooling device 110 is turned off.

In the high-performance mode (i.e., following the "Yes" branch from decision block 402), DRAM temperature stabilization is initiated. At block 406, the load sensor(s) 318 for processors 308, 310 may be read. At block 408, the temperature stabilizer 114 may calculate power from the load sensor reading for processors 308, 310. At block 410, a temperature sensor 322e associated with the processors 308, 310 may be read. Blocks 406, 408, and 410 may be repeated at specified intervals for the processors 308, 310 and any other processors in the SoC 304.

At block 412, the DRAM temperature sensor(s) 322b may be read. At block 414, the temperature stabilizer 114 may predict a rate of change (i.e., slope) of temperature for the DRAM 302 based on the calculated power for the processor(s) and the DRAM temperature sensor readings. At block 416, the temperature stabilizer 114 may access a look-up table to determine a new control setting for the thermoelectric cooling device 110 corresponding to the predicted rate of temperature change. At block 418, the new control setting identified from the look-up table is applied to the thermoelectric cooling device 110 to regulate heat transfer 136. The method 400 may then repeat.

FIG. 5 is an exemplary embodiment of a look-up table 500 for determining the new control setting in block 416 of the method 400 as illustrated in FIG. 4. The gray-scale shaded cells 506 in table 500 may specify an amount of power (in milliwatts—mW) required to drive the thermoelectric cooling device 110. The gray-scale shaded cells 506 in table 500 are identified based on temperature values of the thermoelectric cooling device 110 (column 502) and a predicted heating of the memory 102, 302 (row 504—also listed in mW).

As illustrated in FIG. 5, column 502 lists ranges for a present state of temperature for the thermoelectric cooling device 110 in degrees Celsius based on a temperature sensor 322. Row 504 lists a predicted amount of heat generation that the temperature stabilizer 114 may calculate based on a delta or change in power that the temperature stabilizer may detect from the one or more load sensors 318. The target heat transfer values of row 504 correspond to an amount of predicted heating of memory 102, 302 (in mW) as calculated by the temperature stabilizer 114 and/or as provided by the original equipment manufacturer (OEM) at time of manufacture. The gray-scale shaded cells 506 correspond to an amount of power applied to the thermoelectric cooling device 110 in order remove/transfer/counter-act the predicted heat generation listed in row 504 in order to stabilize the temperature of the memory 102, 302. Initial values of the table 500 may be populated using expected Peltier characteristics for the thermoelectric cooling device 110 at the time of manufacture.

While the temperature values in column 502 are listed in twenty degree intervals or increments, one of ordinary skill in the art will appreciate that other intervals are possible and are included within the scope of this disclosure. For example, other temperature intervals may include, but are not limited to, increments/intervals in five degree increments, ten degree increments, fifteen degree increments, etc. Similarly, while row 504 is provided in increments/intervals of one-hundred mW, other increments may be provided such as, but are not limited to, increments of five mW, ten mW, fifteen mW, twenty mW, etc. The increments in both the rows and columns of table 500 may be adjusted with more specificity or less specificity as desired and as understood by one of ordinary skill in the art.

It should be appreciated that the temperature stabilizer 114 may access the table 500 to look-up the amount of power to be applied to the thermoelectric cooling device 110 in response to the temperature change as predicted by the temperature stabilizer 114. The systems 100, 300 may update the initial table values using a validation process. For example, the system 300 may generate selected values of heat (e.g., 150 mW) and determine the actual power required to maintain isothermal conditions (i.e., keeping the DRAM temp from increasing or decreasing). In other exemplary embodiments, the validation process may be performed at different starting temperatures from those listed in column 502 of table 500.

Figure 6:
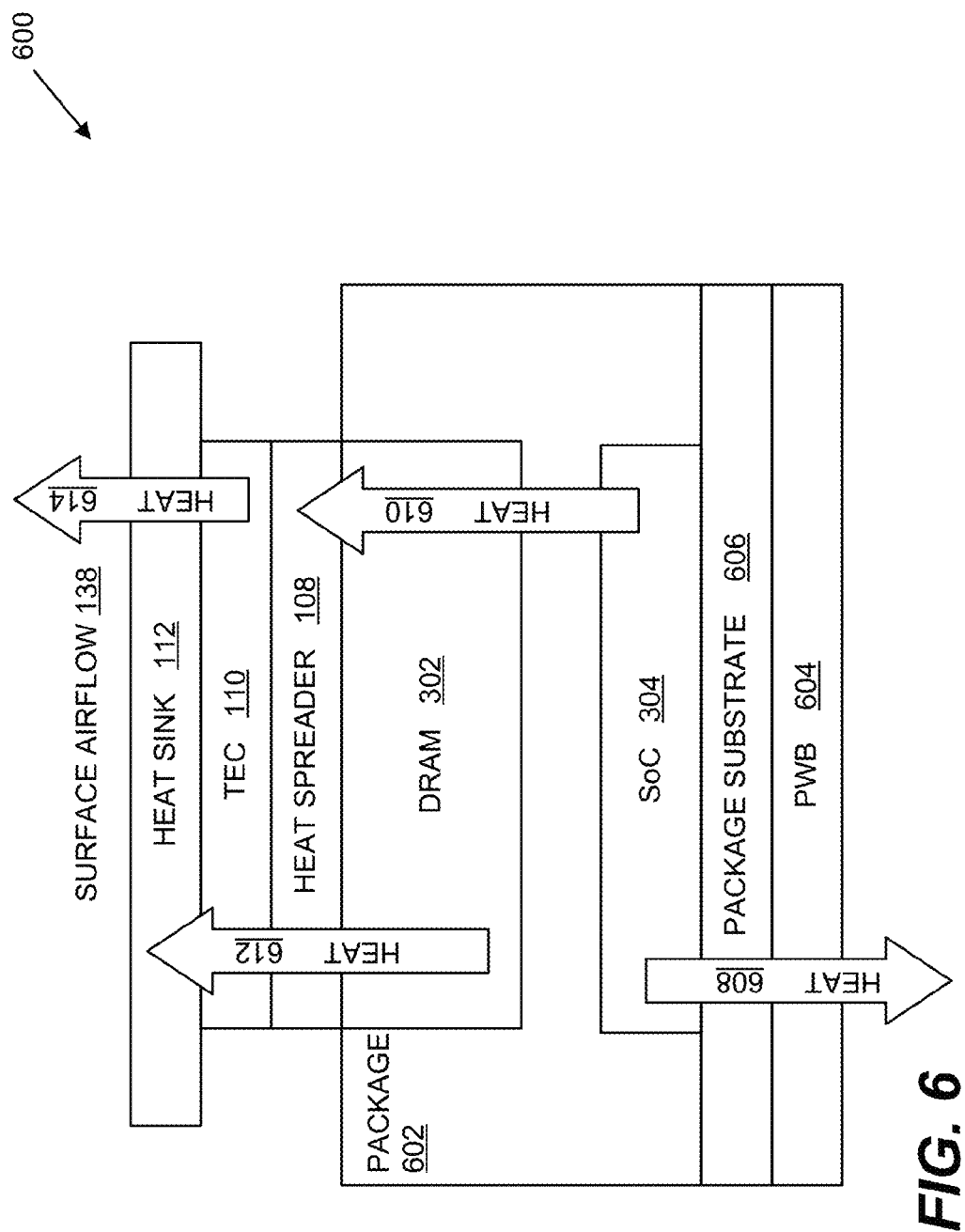
FIG. 6 is a side view of an exemplary embodiment of an electronic package comprising the system of FIG. 3 with a stacked DRAM arrangement.
Figure 7:
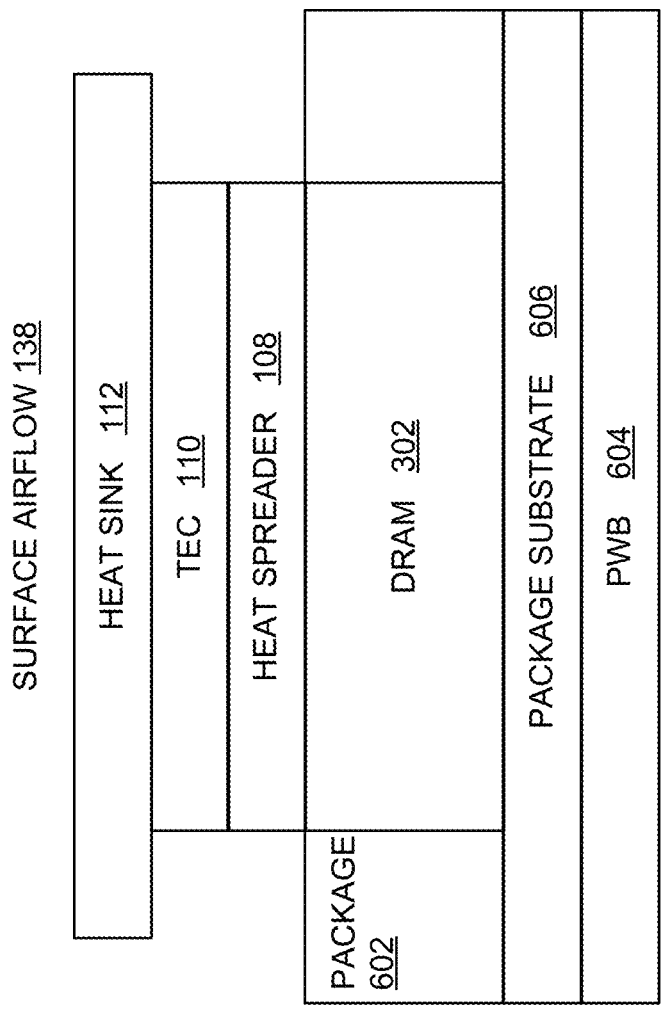
FIG. 7 is a side view of another exemplary embodiment of an electronic package comprising the system of FIG. 3 with a non-stacked DRAM.

As illustrated in FIGS. 6 and 7, the system 300 comprising the SoC 304 and the DRAM 302 may be incorporated in an electronic package 602 comprising a package substrate 606 which may be soldered onto a printed wiring board (PWB) 604. FIG. 6 illustrates a stacked arrangement 600 in which the DRAM 302 is at least partially located above or "stacked" relative to the SoC 304. Heat generation/flow is shown by arrows 608, 610, 612, and 614.

In the stacked arrangement of FIG. 6, both the SoC 304 and the DRAM 302 generate heat. SoC heat 608 flows downward into the printed wiring board 604, and SoC heat 610 flows upward toward the surface airflow 138. In this exemplary embodiment of FIG. 6, the temperature stabilizer 114 controls the heat 610 generated by the SoC 304 and the heat 612 generated by the DRAM 302.

Referring now to FIG. 7, this figure illustrates the electronic package 602 in a non-stacked arrangement similar to the system of FIG. 3. Relative to FIG. 6, in this exemplary embodiment, the SOC 304 is not present. Therefore, DRAM 302 is the main source of heat generation in this exemplary embodiment.

FIGS. 8 and 9 illustrate another exemplary embodiment of a multi-layer, sectored electronic package 800 for providing distributed thermoelectric memory temperature stabilization. Specifically, FIGS. 8 and 9 illustrate a four layered electronic package 800.

The electronic package 800 of FIGS. 8 and 9 comprises four vertical layers 802, 804, 806, and 808 (as illustrated in FIG. 8) with each layer comprising four planar sectors 810, 812, 814, and 816 (as illustrated in FIG. 9). FIG. 8 may be characterized as a side view of the electronic package 800 while FIG. 9 may be characterized as a top view for the electronic package 800. The bottom layer 802 of electronic package 800 may comprise the SoC 304.

Referring to FIGS. 10a-10d, these figures also illustrate a four vertical layered electronic package having layers 802, 804, 806, and 808 similar to FIGS. 8 and 9. As illustrated in the exemplary embodiment of FIG. 10a, a central processing unit (CPU) 1002 may be located in sector 812 of the bottom layer 802 (relative to the sectors and layers as described in FIGS. 8 and 9). A graphics processing unit (GPU) 1008 may be located in sector 816 of the bottom layer 802 (relative to the sectors and layers illustrated in FIGS. 8 and 9). A modem processor 1006 may be located in sector 810 of the bottom layer 802 (relative to the sectors and layers illustrated in FIGS. 8 and 9). And a video processor 1004 may be located in sector 814 of the bottom layer 802 (relative to the sectors and layers illustrated in FIGS. 8 and 9). One or more temperature sensors 322, processor load sensors 318, and processor memory bandwidth sensors 318 may be located in each of the sectors 810, 812, 814, and 816 of the bottom layer 802.

The middle layer 804 (FIG. 10b) may comprise a first layer of DRAM devices 1010, 1012, 1014, and 1016 arranged in corresponding sectors with one or more temperature sensors 322. The middle layer 806 (FIG. 10c) may comprise a second layer of DRAM devices 1018, 1020, 1022, and 1024 arranged in corresponding sectors with one or more temperature sensors 322. The top layer 808 (FIG. 10d) may comprise thermoelectric cooling devices 110a, 110b, 110c, and 110d arranged in corresponding sectors. Each of the thermoelectric cooling devices 110a, 110b, 110c, and 110d may be used to separately control the thermal stabilization for the corresponding sectors 810, 812, 814, and 816, respectively.

For each planar sector, temperature sensors 322 and load sensors 318 may be used as inputs to the temperature stabilizer 114 to determine the total amount of heat generated by each SoC bottom layer 802, each DRAM middle layer 804, and each DRAM middle layer 806. A predetermined percentage of the heat generated from the SoC bottom layer 802 may be exhausted toward the bottom as shown by downward heat flow 608 in FIG. 6. The remainder of the SoC heat may flow upward as shown by heat flow 610. The combined total of the SoC upward heat flow 610 and the middle DRAM layers 804/806 heat flow 612 may be used as an input to table 500 in FIG. 5 to determine where in row 504 the sector is operating. For example, sector 810 may comprise a modem processor 1006 having a processor load sensor 318 reporting a number corresponding to 100 mW of processor heat. By way of example, a portion of the reported processor heat (e.g., 40%) may be previously characterized to be exhausted downward, leaving 60% or 60 mW travelling upward within sector 810.

In an exemplary embodiment, a method for providing distributed temperature control in the layered electronic package 800 may be implemented according to Equations 1-5 below. Equation 1 defines the upward heat generated for the SoC bottom layer 802 within the sector 0 (sector 810).

$$Q0_U = F \cdot K_U \sum_{i=0}^{n-1} LS_{Ui} \qquad \text{Equation 1}$$

where, $F$ = fraction of the total $SoC$ heat migrating upward through $DRAM$;

$K_U$ = scaling factor to convert processor load sensor 318 values to power (determined through characterization);

$n$ = number of independent processor load sensors 318 contributing to $SoC$ heat generation;

$LS_{Ui}$ = individual processor load sensors 318

The memory bandwidth load sensor 318 may report a number corresponding to 100 mW of memory heat. In an embodiment, the load may be assumed to be uniformly distributed across all four sectors 810, 812, 814, and 814 and across both DRAM middle layers 804 and 806. In this regard, the upward memory heat 612 generated within sector 0 (sector 810) for both middle DRAM layers 804 and 806 may comprise 25% or 25 mW.

Equation 2 defines the upward heat generated for DRAM middle layers 804 and 806 within sector 0 (sector 810).

$$Q0_B = \frac{1}{\text{sectors}} \cdot K_E \sum_{i=0}^{n-1} LS_{Bi} \qquad \text{Equation 2}$$

where, sectors = number of sectors in the system package;

$K_B$ = scaling factor to convert processor load sensor 318 values to power (determined through characterization);

$n$ = number of independent load sensors 318 contributing to $DRAM$ heat generation;

$LS_{Bi}$ = individual processor load sensors 318

The combined total predicted heat generation for sector 0 (sector 810) may be 125 mW. Referring to FIG. 5, the nearest operating point may be 100 mW in row 504 of table 500, resulting in a required power of 75 mW sent to the thermoelectric cooler 110*a* for sector 0 (sector 810) to negate the impending increase in temperature.

The net upward heat generated within sector 0 (sector 810) may be determined according to Equation 3.

$$Q0 = Q0_U + Q0_B \qquad \text{Equation 3}$$

Referring to FIG. 5, the value Q0 from Equation 3 may be used to reference row 504 in table 500 to determine which column (heat transfer) sector 0 (sector 810) is operating at. In another embodiment, the method may linearly interpolate a value between 100 mW and 200 mW of row 504, resulting in a required power of 93.75 mW sent to the thermoelectric cooler for sector 0 (sector 810).

Figure 10B:
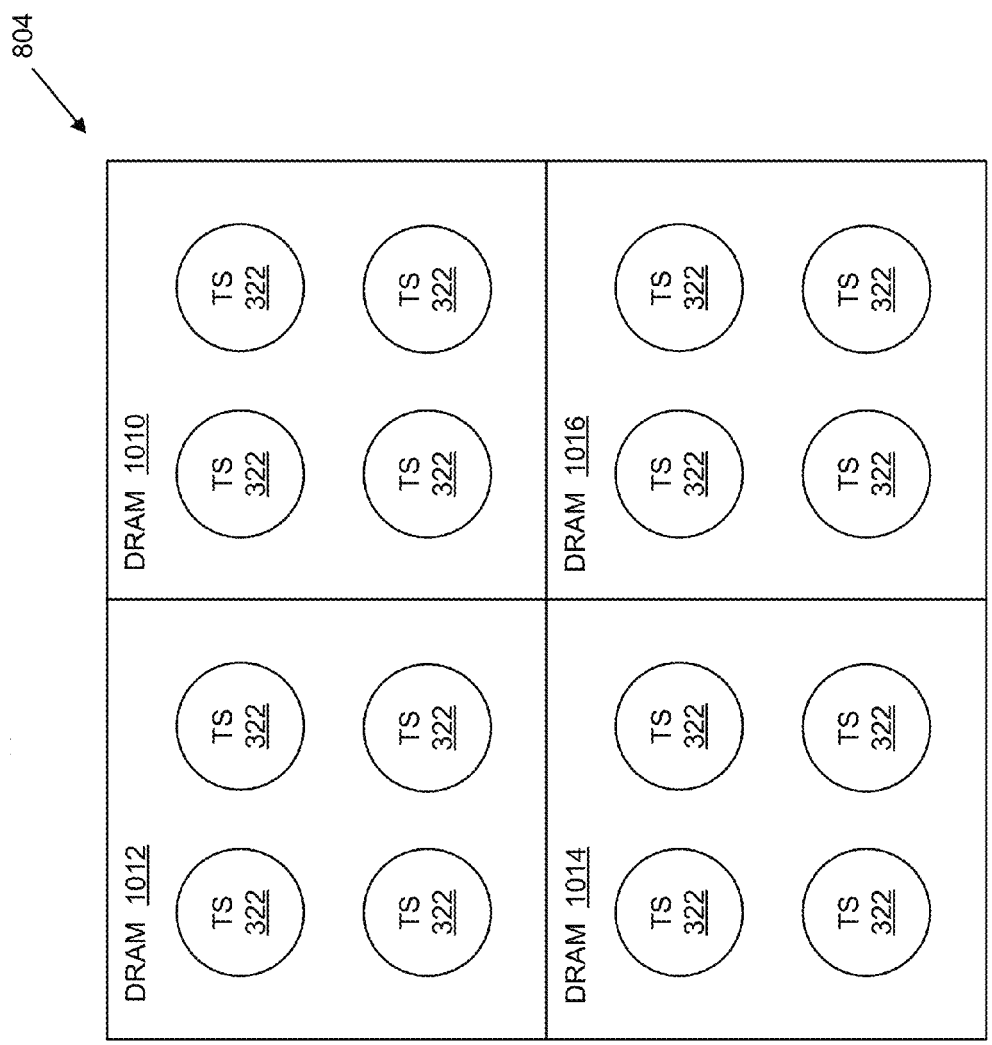
FIG. 10b is an overhead view of the middle DRAM layer 0 in the multi-layer, sectored electronic package of FIG. 8.
Figure 10C:
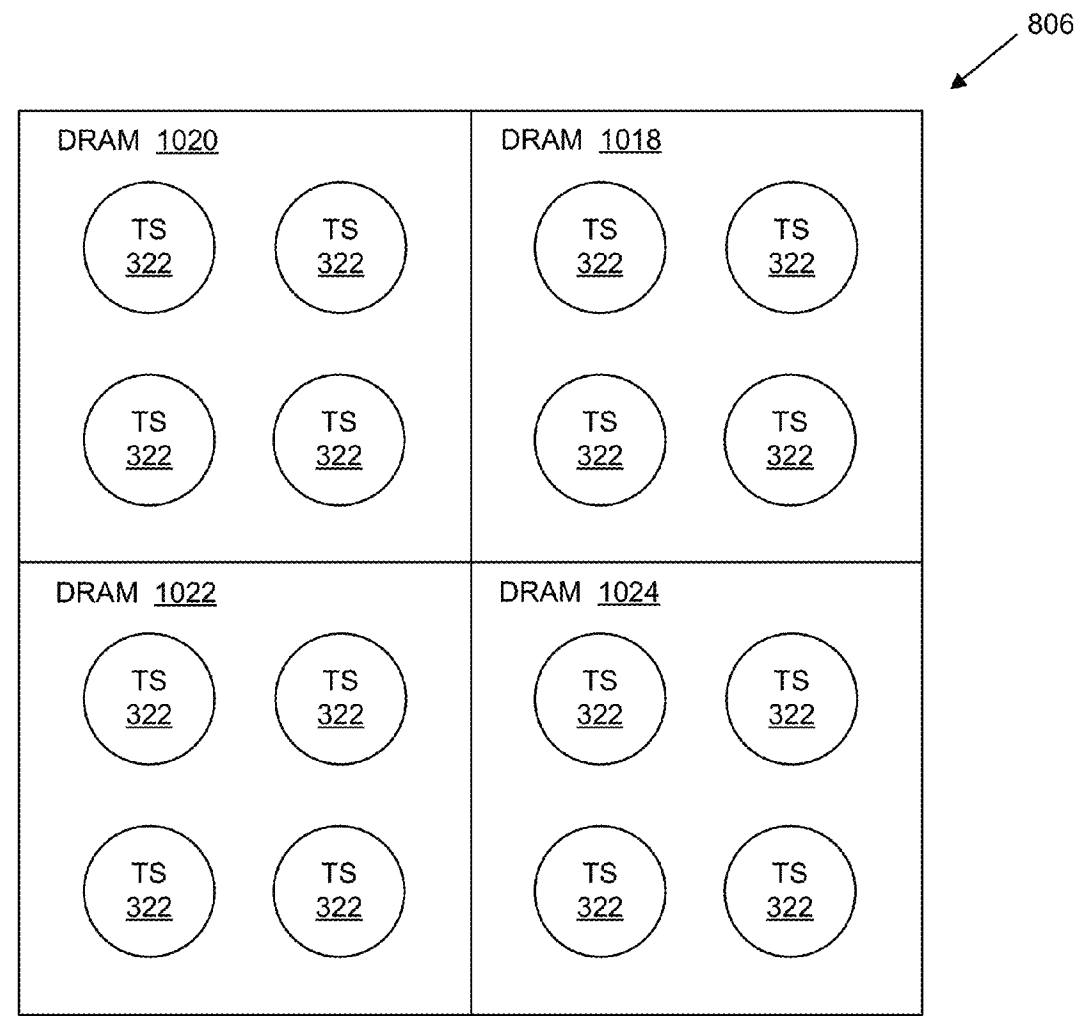
Figure 10D:
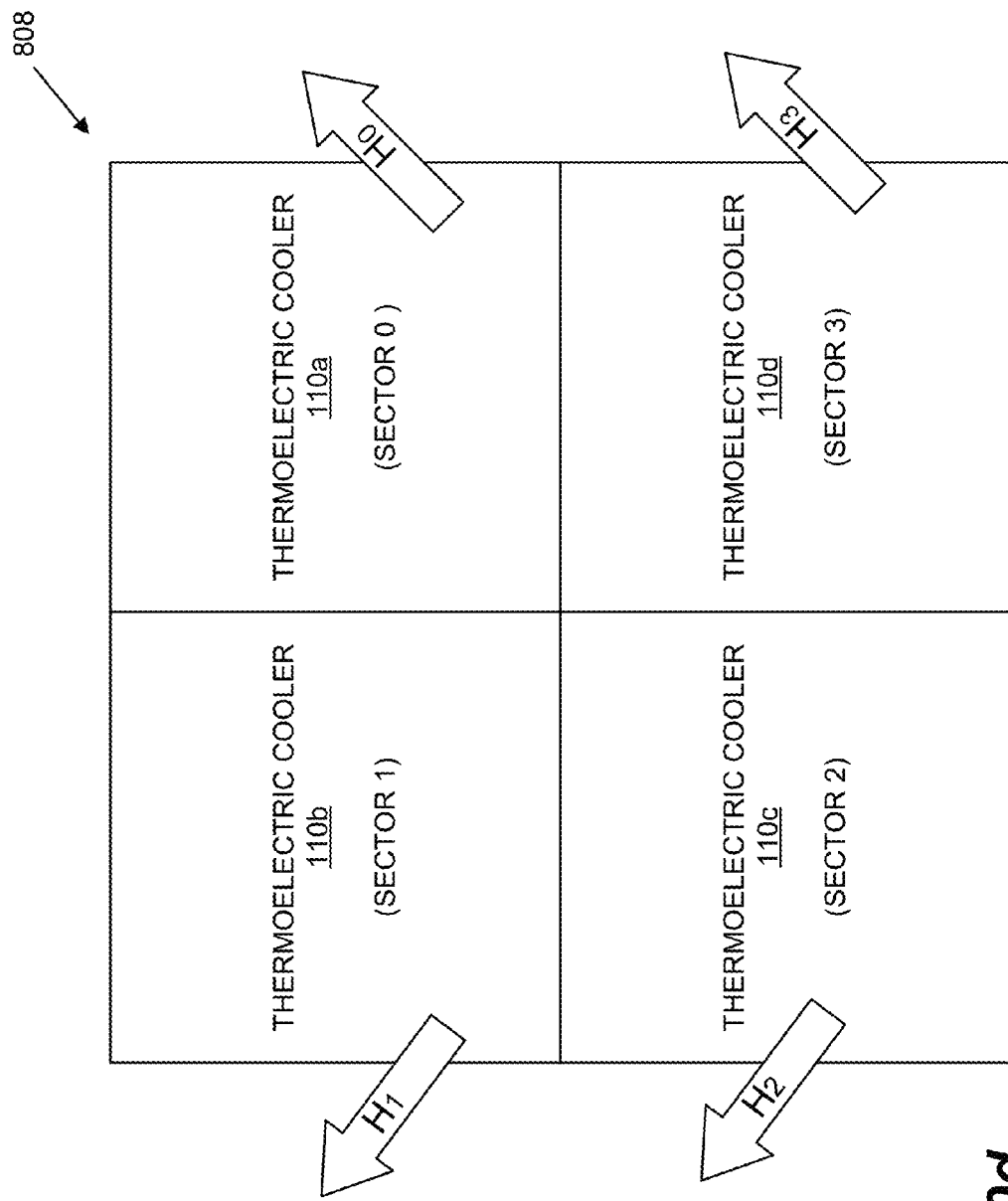
FIG. 10d is an overhead view of the top thermoelectric cooling layer in the multi-layer, sectored electronic package of FIG. 8.

As illustrated in the embodiment of FIGS. 10*a*-10*c*, temperature sensors 322 are similarly arranged by sector. An average temperature for each planar layer in each sector may be determined by calculating the mean value of all temperature sensors 322 within that layer and sector. It should be appreciated that this may permit averaging any local extremes of temperature due to geographical placement of the sensors. For example, within a particular layer and sector, some temperature sensors 322 may be situated near hot spots and others near cool spots depending on what duties the SoC 304 is currently performing. In this manner, averaging may reduce any extremes and provide a more stable temperature value.

Equation 4 defines the average temperature for the SoC bottom 802 within the sector 0 (sector 810).

$$T0_{SoC} = K_{SoC} \frac{1}{n} \sum_{i=0}^{n-1} T_i \qquad \text{Equation 4}$$

where, $K_{SoC}$ = scaling factor to convert temperature sensor 322 values to temperature (determined through characterization);

$n$ = number of independent temperature sensors 322 within the sector;

$T_i$ = individual temperature sensors 322

Equation 5 defines the average temperature for the DRAM middle layer within sector 0 (sector 810).

$$T0_{DRAM} = K_{DRAM} \frac{1}{n} \sum_{i=0}^{n-1} T_i \qquad \text{Equation 5}$$

where, $K_{DRAM}$ = scaling factor to convert temperature sensor 322 values to temperature (determined through characterization);

$n$ = number of independent temperature sensors 322 within the sector;

$T_i$ = individual temperature sensors 322

The net temperature within sector 0 (sector 810) may be determined according to Equation 6.

$$T0 = \frac{1}{m}\sum_{i=0}^{m-1} T_i \qquad \text{Equation 6}$$

where, $T_i$ = individual layers temperatures ($T0_{SoC}, T0_{DRAM0}, T0_{DRAM1}$, etc.) within sector 0

The averaged temperature value T0 for the sector is then used as an input to column 502 of table 500 in FIG. 5. Depending on the average temperature, a different row of operation in table 500 may occur, affecting the amount of power 506 which is sent to sector0 thermoelectric cooler 110*a*. In this sector0 example, table 500 has zero sensitivity to temperature input because all grey shaded cells show no change in power irrespective of row or temperature. It should be appreciated that other tables may implement unique values across temperature, hence the consideration of both the load sensors and temperature sensors in table 500.

Figure 11:
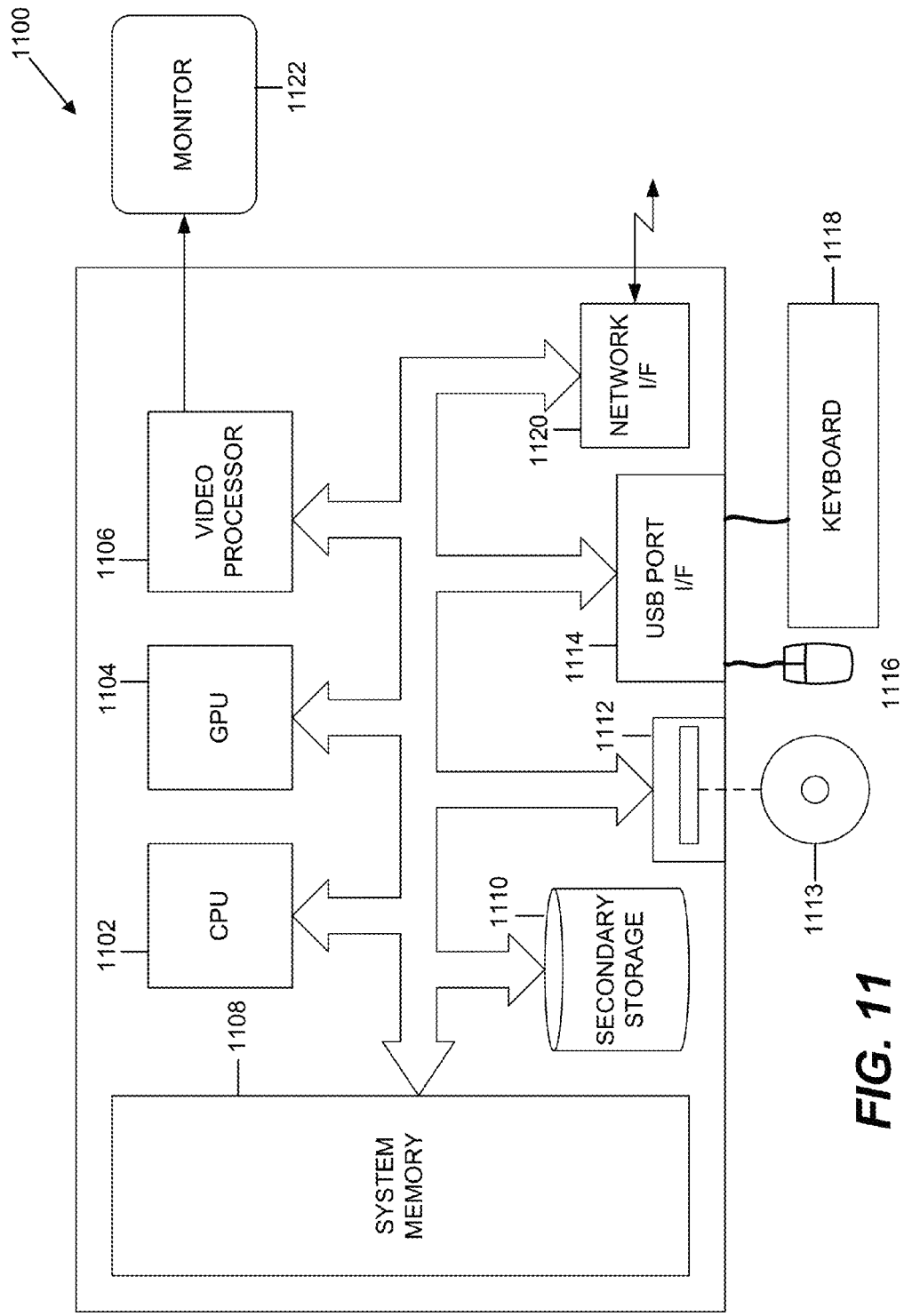
FIG. 11 is a block diagram of an exemplary embodiment of a computer for incorporating thermoelectric memory temperature stabilization.

As illustrated in FIG. 11, in other exemplary embodiments the above-described systems 100 and 300 (FIGS. 1 and 3) may be included in a computing device 1100 that may comprise a general purpose computer. The computing device 1100 may comprise a central processing unit (CPU) 1102, a graphics processing unit (GPU) 1104, a video processor 1106, a system memory 1108 and mass-storage devices, such as a non-removable media (e.g., FLASH memory, eMMC, magnetic disk, etc.) data storage 1110 and a removable-media drive 1112 (e.g., DVD-ROM, CD-ROM, Blu-ray disc, etc.). For example, removable-media drive 1112 may accept a DVD-ROM 1113. The terms "disk" and "disc," as used herein, include compact disc (CD), laser disc, optical disc, digital versatile disc (DVD), floppy disk and Blu-ray disc. Combinations of the above are also included within the scope of computer-readable media. Computer device 1100 may also include a USB port 1114, to which user interface devices or other peripheral devices, such as a mouse 1116 and a keyboard 1118, may be connected. In addition, computer device 1100 may include a network interface 1120 to enable communication between the computer device 1100 and an external network, such as the Internet. User interface peripheral devices may also include a video monitor 1122, which may be connected to the video processor 1106.

Figure 12:
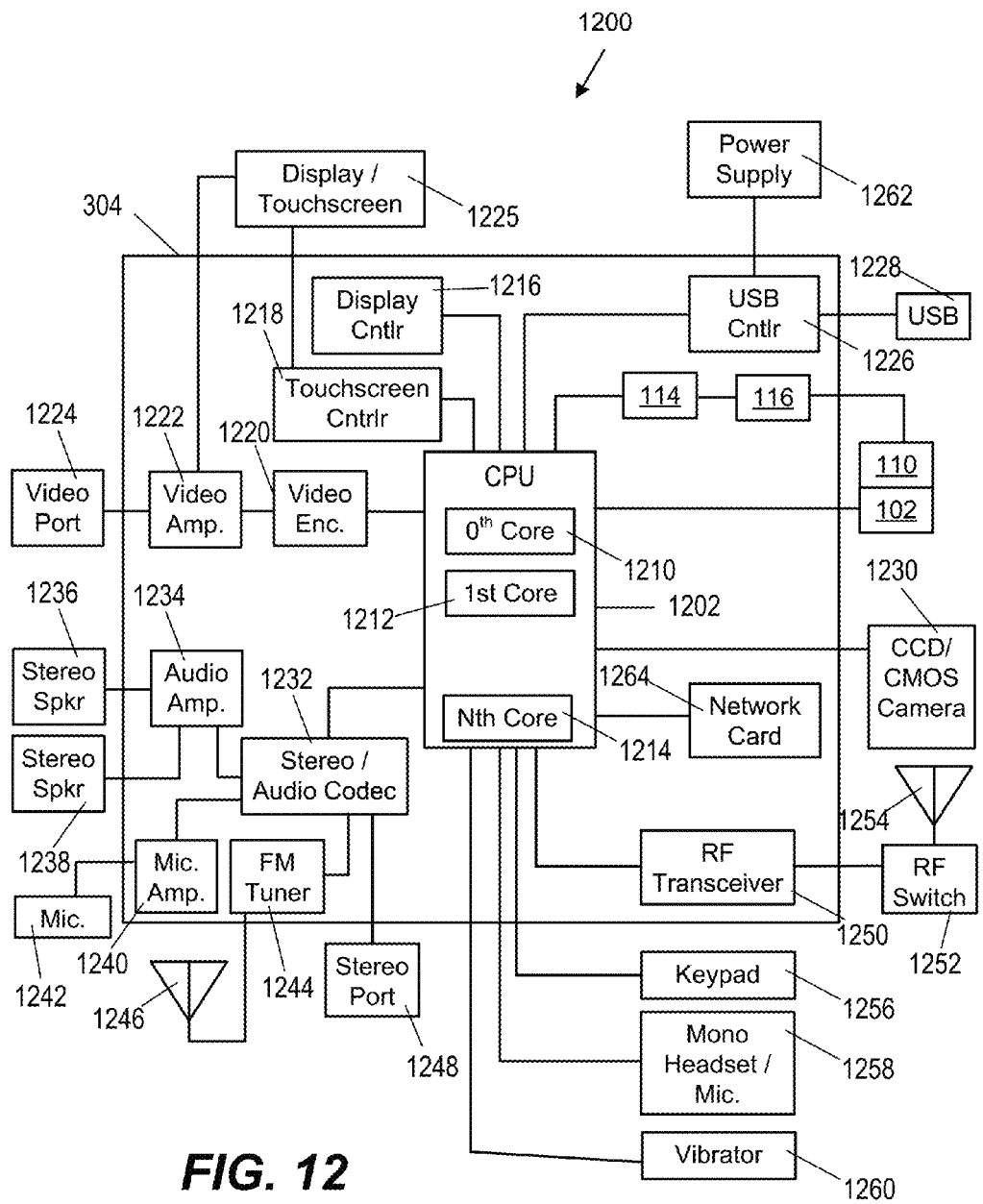
FIG. 12 is a block diagram of an exemplary embodiment of a portable communication device for incorporating thermoelectric memory temperature stabilization.

FIG. 12 is a block diagram of an exemplary embodiment of a portable computing device (PCD) 1200 that may comprise a mobile phone for incorporating the thermoelectric memory temperature stabilization systems 100, 300 of FIGS. 1 and 3 as described above. Besides a mobile phone, the PCD 1200 may also comprise a personal digital assistant (PDA), a pager, a tablet, a smartphone, a navigation device, and a hand-held computer with a wireless connection or link.

It will be readily appreciated that certain components of the system 100 are included on the SoC 304 (e.g., temperature stabilizer 114, power manager 116) while other components (e.g., memory 102, thermoelectric cooling device(s) 110) are external components coupled to the SoC 304. The SoC 304 may include a multicore CPU 1202. The multicore CPU 1202 may include a zeroth core 1210, a first core 1212, and an Nth core 1214. One of the cores may comprise, for example, a graphics processing unit (GPU) with one or more of the others comprising the CPU.

A display controller 1216 and a touch screen controller 1218 may be coupled to the CPU 1202. In turn, the touch screen display 1225 external to the SoC 304 may be coupled to the display controller 1216 and the touch screen controller 1218.

FIG. 12 further shows that a video encoder 1220, a phase alternating line (PAL) encoder, a sequential color a memoire (SECAM) encoder, or a national television system(s) committee (NTSC) encoder, is coupled to the multicore CPU 1202. Further, a video amplifier 1222 is coupled to the video encoder 1220 and the touch screen display 1225. Also, a video port 1224 is coupled to the video amplifier 1222. As shown in FIG. 12, a universal serial bus (USB) controller 1226 is coupled to the multicore CPU 1202. Also, a USB port 1228 is coupled to the USB controller 1226. Memory 102 may be coupled to the CPU 1202 residing on SoC 304, and the thermoelectric cooling device(s) 110 may be coupled to the CPU 1202 via the temperature stabilizer 114 and the power manager 116 (as illustrated in FIG. 1).

Further, as shown in FIG. 12, a digital camera 1230 may be coupled to the multicore CPU 1202. In an exemplary aspect, the digital camera 1230 is a charge-coupled device (CCD) camera or a complementary metal-oxide semiconductor (CMOS) camera.

As further illustrated in FIG. 12, a stereo audio coder-decoder (CODEC) 1232 may be coupled to the multicore CPU 1202. Moreover, an audio amplifier 1234 may be coupled to the stereo audio CODEC 1232. In an exemplary aspect, a first stereo speaker 1236 and a second stereo speaker 1238 are coupled to the audio amplifier 1234. A microphone amplifier 1240 may be also coupled to the stereo audio CODEC 1232. Additionally, a microphone 1242 may be coupled to the microphone amplifier 1240. In a particular aspect, a frequency modulation (FM) radio tuner 1244 may be coupled to the stereo audio CODEC 1232. Also, an FM antenna 1246 is coupled to the FM radio tuner 1244. Further, stereo headphones port 1248 may be coupled to the stereo audio CODEC 1232.

FIG. 12 further illustrates that a radio frequency (RF) transceiver 1250 may be coupled to the multicore CPU 1202. An RF switch 1252 may be coupled to the RF transceiver 1250 and an RF antenna 1254. A keypad 1256 may be coupled to the multicore CPU 1202. Also, a mono headset with a microphone 1258 may be coupled to the multicore CPU 1202. Further, a vibrator device 1260 may be coupled to the multicore CPU 1202.

FIG. 12 also shows that a power supply 1262 may be coupled to the SoC 304. In a particular aspect, the power supply 1262 is a direct current (DC) power supply that provides power to the various components of the PCD 1200 that require power. Further, in a particular aspect, the power supply is a rechargeable DC battery or a DC power supply that is derived from an alternating current (AC) to DC transformer that is connected to an AC power source.

The PCD 1200 may also include a network card 1264 that may be used to access a data network (e.g., a local area network, a personal area network, or any other network). The network card 1264 may be a Bluetooth network card, a WiFi network card, a personal area network (PAN) card, a personal area network ultra-low-power technology (PeANUT) network card, a television/cable/satellite tuner, or any other network card well known in the art. Further, the network card 1264 may be incorporated into a chip. The network card 1264 may be a full solution in a chip, and may not be a separate network card 1264.

As illustrated in FIG. 12, the touch screen display 1225, the video port 1224, the USB port 1228, the camera 1230, the first stereo speaker 1236, the second stereo speaker 1238, the microphone 1242, the FM antenna 1246, the stereo headphones 1248, the RF switch 1252, the RF antenna 1254, the keypad 1256, the mono headset 1258, the vibrator 1260, and the power supply 1262 may be external to the SoC 304.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Alternative exemplary embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for thermally controlling memory, the method comprising:
   determining with a temperature stabilizer a workload of one or more processors and a temperature of the one or more processors;
   determining with the temperature stabilizer a temperature of a memory accessed by the one or more processors via a memory controller, the temperature stabilizer located remotely from the memory;
   predicting with the temperature stabilizer a temperature change of the memory based on the temperature of the memory the determined workload of the one or more processors and the determined temperature of the one or more processors; and
   thermally controlling the memory with a thermoelectric cooling device in response to the predicted temperature change.

2. The method of claim 1, wherein the thermally controlling the memory comprises:
   increasing heat transfer associated with the thermoelectric cooling device for a predicted increase in temperature of the memory; and
   decreasing heat transfer associated with the thermoelectric cooling device for a predicted decrease in temperature of the memory.

3. The method of claim 1, wherein the determining the workload of one or more processors comprises receiving a signal from a load sensor associated with the one or more processors.

4. The method of claim 1, wherein the determining the workload of the one or more processors comprises receiving a workload value from an operating system.

5. The method of claim 1, wherein the predicted temperature change of the memory is further based on one or more of a processor utilization percentage and a processor memory bandwidth.

6. The method of claim 1, wherein the predicting the temperature change of the memory comprises calculating a rate of temperature change of the memory.

7. The method of claim 1, wherein the memory comprises a dynamic random access memory (DRAM) device.

8. The method of claim 1, wherein the one or more processors and the memory controller reside on a system on chip (SoC) and the memory is electrically coupled to the memory controller via a bus.

9. The method of claim 1, wherein the memory, the thermoelectric cooling device, the memory controller, and the one or more processors are incorporated in an electronic package.

10. The method of claim 1, wherein the memory, the thermoelectric cooling device, the memory controller, and the one or more processors are incorporated in one of a personal computer, a server, a tablet, and a mobile phone.

11. A system for thermally controlling memory, the system comprising:
   means for determining a workload of one or more processors and a temperature of the one or more processors;
   means for determining a temperature of a memory accessed by one or more processors;
   means for predicting a temperature change of the memory based on the temperature of the memory the determined workload of the one or more processors and the determined temperature of the one or more processors; and
   means for thermally stabilizing the memory in response to the predicted temperature change.

12. The system of claim 11, wherein the means for thermally controlling the memory in response to the predicted temperature change comprises a thermoelectric cooling device.

13. The system of claim 12, further comprising:
   means for increasing a heat transfer associated with the thermoelectric cooling device in response to a predicted increase in temperature for the memory; and
   means for decreasing the heat transfer associated with the thermoelectric cooling device in response to a predicted decrease in temperature for the memory.

14. The system of claim 11, wherein the means for thermally controlling the memory in response to the predicted temperature change comprises:
   means for cooling the memory in response to a predicted increase in temperature for the memory; and
   means for heating the memory in response to a predicted decrease in temperature for the memory.

15. The system of claim 11, wherein the means for predicting the temperature change of the memory comprises means for calculating a rate of temperature change of the memory.

16. The system of claim 11, wherein the memory comprises a dynamic random access memory (DRAM) device electrically coupled to a system on chip (SoC) comprising the one or more processors.

17. The system of claim 11, wherein the means for determining the temperature of the memory comprises a temperature sensor.

18. The system of claim 11, wherein the predicted temperature change of the memory is further based on one or more of a current processor utilization percentage and a current processor memory bandwidth.

19. The system of claim 11 incorporated in an electronic package.

20. The system of claim 11 incorporated in one of a personal computer, a server, a tablet, and a mobile phone.

21. A computer program embodied in a non-transitory computer readable medium embodied and executable by a processor for thermally controlling memory, the computer program comprising logic configured to:
   determine a workload of one or more processors and a temperature of the one or more processors
   determine a temperature of a memory accessed by the one or more processors;
   predict a temperature change of the memory based on the temperature of the memory the determined workload of the one or more processors and the determined temperature of the one or more processors; and
   thermally control the memory in response to the predicted temperature change.

22. The computer program of claim 21, wherein the logic configured to thermally control the memory in response to the predicted temperature change comprises logic configured to control a thermoelectric cooling device thermally coupled to a heat spreader between the memory and a heat sink.

23. The computer program of claim 22, wherein the logic configured to control the thermoelectric cooling device comprises logic configured to:
   increase a heat transfer associated with the thermoelectric cooling device for a predicted increase in temperature of the memory; and
   decrease the heat transfer associated with the thermoelectric cooling device for a predicted decrease in temperature of the memory.

24. The computer program of claim 22, wherein the logic configured to control the thermoelectric cooling device comprises logic configured to determine a power input to the thermoelectric cooling device.

25. The non-transitory computer readable medium of claim 21, wherein the logic configured to predict the temperature change of the memory based on the temperature of the memory comprises logic configured to calculate a rate of temperature change of the memory.

26. The computer program of claim 21, wherein the memory comprises a dynamic random access memory (DRAM) device electrically coupled to a system on chip (SoC) comprising the one or more processors.

27. The computer program of claim 21, wherein the logic configured to determine the temperature of the memory comprises logic configured to read a temperature sensor.

28. The computer program of claim 21, wherein the predicted temperature change is further based on one or more of a processor workload value and a processor memory bandwidth value.

29. The computer program of claim 21 incorporated in a system on chip (SoC).

30. The computer program of claim 21 incorporated in one of a personal computer, a server, a tablet, and a mobile phone.

31. A system for thermally controlling memory, the system comprising:
   a memory;
   one or more processors that access the memory via a memory controller electrically coupled to the memory;
   a temperature stabilizer remote from the memory and in communication with the one or more processors, the temperature stabilizer configured to predict a change in a temperature of the memory based on a current temperature of the memory, a workload of the one or more processors, and a temperature of the one or more processors; and
   a thermoelectric cooling device configured to thermally control the memory in response to the predicted change in temperature of the memory.

32. The system of claim 31, wherein the thermoelectric cooling device is configured to:
   cool the memory when the predicted change in temperature is increasing; and
   heat the memory when the predicted change in temperature is decreasing.

33. The system of claim 31, wherein the memory comprises a volatile memory device.

34. The system of claim 33, wherein the volatile memory device comprises a dynamic random access memory (DRAM) device.

35. The system of claim 31, wherein the workload of one or more processors is determined based on a load sensor associated with the one or more processors.

36. The system of claim 35, further comprising:
a temperature sensor for sensing the temperature of the memory;
a processor temperature sensor for sensing the temperature of the processor; and
wherein the load sensor comprises a processor utilization load sensor.

37. The system of claim 31, wherein the one or more processors and the memory controller reside on a system on chip (SoC) and the memory is electrically coupled to the memory controller via a bus.

38. The system of claim 31 incorporated in an electronic package.

39. The system of claim 31 incorporated in one of a personal computer, a server, a tablet, and a mobile phone.

40. The system of claim 31, wherein the memory comprises a dynamic random access memory (DRAM) device electrically coupled to a system on chip (SoC) in a stacked arrangement.

* * * * *